United States Patent
Shin et al.

(10) Patent No.: US 9,508,398 B1
(45) Date of Patent: Nov. 29, 2016

(54) VOLTAGE GENERATION CIRCUIT, SEMICONDUCTOR MEMORY DEVICE INCLUDING THE SAME, AND METHOD FOR DRIVING THE SAME

(71) Applicant: SK hynix Inc., Gyeonggi-do (KR)

(72) Inventors: Yoon-Jae Shin, Gyeonggi-do (KR); Jae-Boum Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/047,273

(22) Filed: Feb. 18, 2016

(30) Foreign Application Priority Data

Sep. 10, 2015 (KR) .......................... 10-2015-0128058

(51) Int. Cl.
| | |
|---|---|
| G11C 16/04 | (2006.01) |
| G11C 5/14 | (2006.01) |
| G05F 1/46 | (2006.01) |
| G11C 7/06 | (2006.01) |
| G11C 7/08 | (2006.01) |
| G11C 7/12 | (2006.01) |
| G11C 11/4074 | (2006.01) |

(52) U.S. Cl.
CPC .............. *G11C 5/147* (2013.01); *G05F 1/468* (2013.01); *G11C 5/145* (2013.01); *G11C 7/062* (2013.01); *G11C 7/08* (2013.01); *G11C 7/12* (2013.01); *G11C 11/4074* (2013.01)

(58) Field of Classification Search
CPC ... G11C 16/30; G11C 5/147; G11C 11/4074; G11C 5/145; G11C 8/08; G11C 11/4091; G11C 7/06; G11C 7/065
USPC ............................ 365/189.09, 205, 207, 203
See application file for complete search history.

(56) References Cited

U.S. PATENT DOCUMENTS 8,416,631 B2 * 4/2013 Kim .................... G11C 5/14
365/100
2011/0285451 A1  11/2011 Neidorff

FOREIGN PATENT DOCUMENTS

| KR | 100570076 | 4/2006 |
|---|---|---|
| KR | 100881398 | 2/2009 |

\* cited by examiner

*Primary Examiner* — David Lam
(74) *Attorney, Agent, or Firm* — IP & T Group LLP (57) ABSTRACT

A semiconductor memory device includes a voltage generation unit suitable for selecting one of the voltages which are supplied to a first and a second source voltage terminals, as a source voltage based on a driving mode signal, and generating a bit line precharge voltage by dividing the source voltage according to a resistance ratio determined based on the driving mode signal; a sense amplifier driving unit suitable for receiving the bit line precharge voltage based on a bit line precharge signal and a sense amplifier control signal, and providing a driving voltage through a pull-up power line and a pull-down power line; and a bit line sense amplifier suitable for sensing and amplifying data of a bit line pair by using the driving voltage supplied through the pull-up power line and the pull-down power line.

26 Claims, 6 Drawing Sheets

VOLTAGE GENERATION CIRCUIT, SEMICONDUCTOR MEMORY DEVICE INCLUDING THE SAME, AND METHOD FOR DRIVING THE SAME

CROSS-REFERENCE TO RELATED APPLICATIONS

The present application claims priority of Korean Patent Application No. 10-2015-0128058, filed on Sep. 10, 2015, which is incorporated herein by reference in its entirety.

BACKGROUND

1. Field

Exemplary embodiments of the present invention relate to a semiconductor design technology and more particularly, to a semiconductor memory device including a voltage generation circuit.

2. Description of the Related Art

Typically, semiconductor memory devices receive a power supply voltage VDD and a ground voltage VSS from an external source, and generate internal voltages used for performing internal operations.

The voltages used in the Internal operations may include a core voltage VCORE supplied to a memory area, a high voltage VPP used to drive a word line or used in overdriving, a back bias voltage VBB supplied as a bulk voltage of an NMOS transistor of the core area, and the like.

Furthermore, the voltages used in the internal operations may include a cell plate voltage VCP used as a plate voltage of a memory cell capacitor, and a bit line precharge voltage VBLP used for precharging a bit line. In general, the cell plate voltage VCP and the bit line precharge voltage VBLP have a voltage level corresponding to one half of the core voltage VCORE (i.e., VCORE/2), and thus the cell plate voltage VCP and the bit line precharge voltage VBLP may be generated by using the core voltage VCORE.

As the degree of integration of a semiconductor memory device increases, the power supply voltage VDD is reduced. Accordingly, the internal voltages used in the semiconductor memory device are also reduced. Particularly, a decrease of the core voltage VCORE, which has a lower level than the power supply voltage VDD, may result in a decrease in the data sensing margin of the semiconductor memory device using the bit line precharge voltage VBLP (i.e., VCORE/2), in a low voltage (i.e., VDD) environment.

Figure 1A:
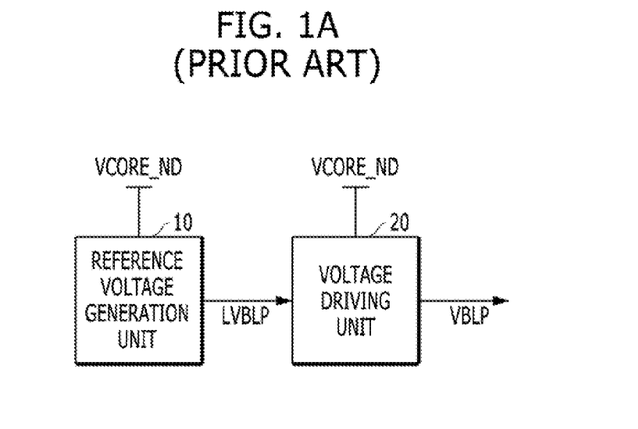
FIG. 1A is a block diagram illustrating a conventional voltage generation circuit of a semiconductor memory device.

FIG. 1A is a block diagram illustrating a conventional voltage generation circuit of a semiconductor memory device.

Referring to FIG. 1A, the conventional voltage generation circuit includes a reference voltage generation unit 10 and a voltage driving unit 20. The reference voltage generation unit 10 may divide a voltage inputted through a core voltage terminal VCORE_ND to generate a reference voltage LVBLP. The voltage driving unit 20 may drive an output terminal according to the reference voltage LVBLP to generate a bit line precharge voltage VBLP.

Figure 1B:
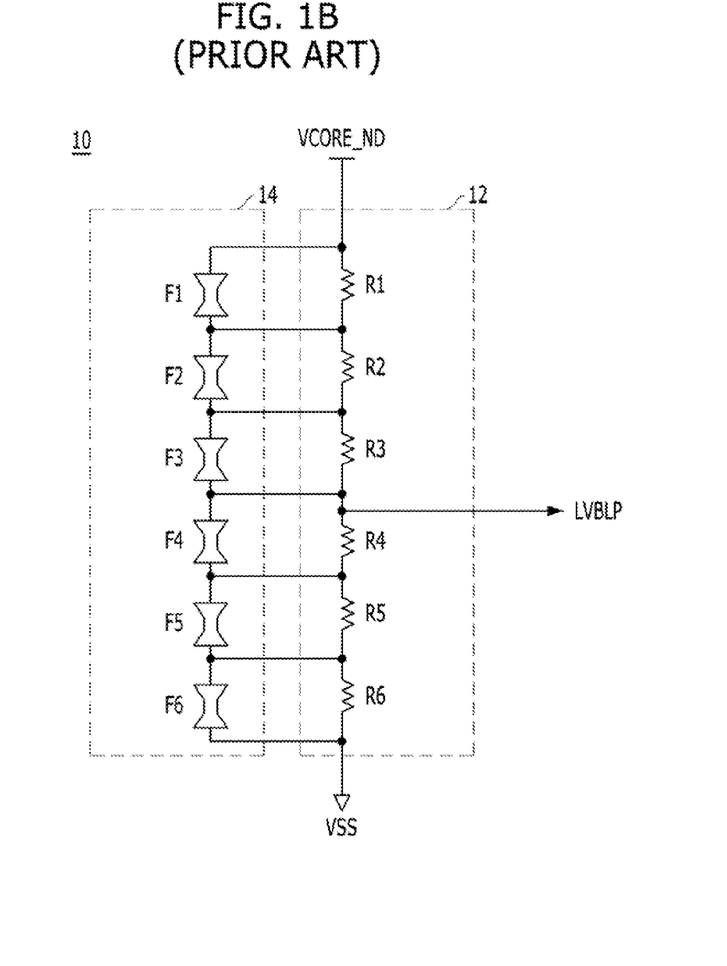
FIG. 1B is a circuit diagram of a reference voltage generation unit shown in FIG. 1A.

FIG. 1B is a diagram of the reference voltage generation unit 10 shown in FIG. 1A.

Referring to FIG. 1B, the reference voltage generation unit 10 includes a voltage division section 12 and a voltage trimming section 14. The voltage division section 12 includes a plurality of resistors R1 to R6 connected in series between the core voltage terminal VCORE_ND and a ground voltage terminal VSS. The reference voltage LVBLP may be outputted from an intermediate node of the resistors R3 and R4.

The voltage trimming section 14 may adjust a division ratio determined by the resistors R1 to R6 to allow the reference voltage LVBLP to have a voltage level corresponding to one half of a core voltage VCORE (i.e., VCORE/2).

The voltage trimming section 14 may select a voltage level to be divided by the voltage division section 12 by using a switching circuit and particularly, may include fuses F1 to F6 coupled in parallel to respective resistors R1 to R6 of the voltage division section 12. That is, at a wafer level, the fuses F1 to F6 are programmed (i.e., blowing or rupture) through a test so that the reference voltage generation unit 10 may generate the reference voltage LVBLP to have a level of VCORE/2.

Accordingly, when a specific voltage is supplied through the core voltage terminal VCORE_ND, the reference voltage generation unit 10 may generate the reference voltage LVBLP having a level of VCORE/2, and the voltage driving unit 20 may drive the output terminal according to the reference voltage LVBLP to generate the bit line precharge voltage VBLP. That is, the bit line precharge voltage VBLP may be generated in cooperation with the core voltage terminal VCORE_ND.

Figure 2:
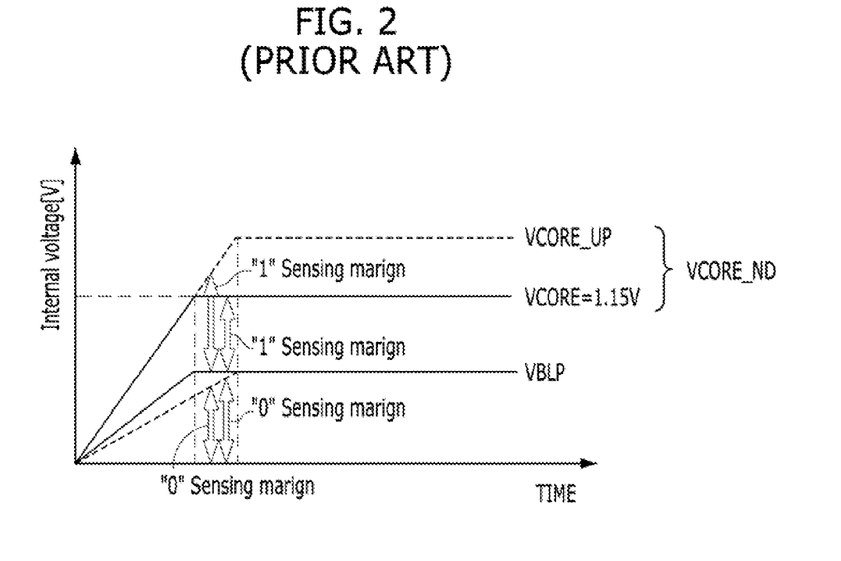
FIG. 2 is a graph illustrating a data margin of a semiconductor memory device including the conventional voltage generation circuit shown in FIGS. 1A and 1B, in a low voltage environment.

FIG. 2 is a graph describing a data margin of a semiconductor memory device including the conventional voltage generation circuit shown in FIGS. 1A and 1B, in a low voltage environment.

Generally, in a semiconductor memory device, a bit line is precharged by the bit line precharge voltage VBLP before a read or write operation is performed. A bit line sense amplifier of the semiconductor memory device performs an operation for sensing and amplifying memory cell data transmitted through the bit line during the read or write operation. The bit line sense amplifier performs the amplification operation by using driving voltages, for example, the core voltage VCORE and the ground voltage VSS, supplied through a pull-up power line RTO and a pull-down power line SB, respectively.

In a low voltage environment, during the read or write operation, to ensure a data sensing margin for a data value "1", a core-up driving mode is employed to supply a core-up voltage VCORE_UP higher than the core voltage VCORE to the core voltage terminal VCORE_ND. That is, in a normal driving mode, the core voltage VCORE is supplied through the core voltage terminal VCORE_ND, while in a core-up driving mode, the core-up voltage VCORE_UP is supplied through the core voltage terminal VCORE_ND.

Accordingly, when the semiconductor memory device enters a core-up driving mode, the bit line is precharged using the bit line precharge voltage VBLP, and then the core-up voltage VCORE_UP and the ground voltage VSS are supplied through the pull-up and pull-down power lines RTO, SB, respectively. The bit line sense amplifier may then perform an operation for sensing and amplifying memory cell data loaded on the bit line by using the core-up voltage VCORE_UP and the ground voltage VSS.

As described in FIGS. 1A and 1B, the bit line precharge voltage VBLP may vary depending on the voltage supplied to the core voltage terminal VCORE_ND, so that the bit line precharge voltage VBLP may increase according to the core-up voltage VCORE_UP in the core-up driving mode. Accordingly, as illustrated in FIG. 2, at an initial state of the core-up driving mode, even though a data sensing margin of a data value "1" is ensured, a data sensing margin of a data value "0" is not sufficient. Therefore, an operation error of the semiconductor memory device may occur.

SUMMARY

Various embodiments are directed to a voltage generation circuit that may generate a bit line precharge voltage by using a dedicated source voltage irrelative to a core voltage in a core-up driving mode, and a semiconductor memory device including the same.

In an embodiment, a semiconductor memory device may include: a voltage generation unit suitable for selecting one of the voltages which are supplied to a first and a second source voltage terminals, as a source voltage based on a driving mode signal, and generating a bit line precharge voltage by dividing the source voltage according to a resistance ratio determined based on the driving mode signal; a sense amplifier driving unit suitable for receiving the bit line precharge voltage based on a bit line precharge signal and a sense amplifier control signal, and providing a driving voltage through a pull-up power line and a pull-down power line; and a bit line sense amplifier suitable for sensing and amplifying data of a bit line pair by using the driving voltage supplied through the pull-up power line and the pull-down power line.

In an embodiment, a voltage generation circuit may include: a source voltage selection section suitable for selecting one of voltages supplied to a first source voltage terminal and a second source voltage terminal in response to a driving mode signal, and providing the selected voltage as a source voltage; a division ratio adjustment section suitable for dividing the source voltage based on a resistance ratio determined based on the driving mode signal, and outputting a reference voltage; and a voltage driving section suitable for driving an internal voltage terminal in response to the reference voltage and generating an Internal voltage.

In an embodiment, a method for driving a semiconductor memory device may include: selecting one of voltages supplied to a first source voltage terminal and a second source voltage terminal as a source voltage in response to a driving mode signal, and generating a bit line precharge voltage by dividing the source voltage based on a resistance ratio determined based on the driving mode signal; providing the bit line precharge voltage to a sense amplifier as a driving voltage through a pull-up power line and a pull-down power line in response to a bit line precharge signal, and providing a voltage supplied from the first source voltage terminal and a ground voltage to the sense amplifier as a driving voltage through the pull-up power line and the pull-down power line in response to a sense amplifier control signal; and sensing and amplifying data of a bit line pair by using the driving voltage supplied through the pull-up power line and the pull-down power line.

The semiconductor memory device according to an embodiment of the present invention may generate a bit line precharge voltage by using a dedicated source voltage having no relation to a core voltage, thereby ensuring a data sensing margin of a data value "0" as well as a data sensing margin of a data value "1" in an initial operation of a core-up driving mode.

Furthermore, the semiconductor memory device according to an embodiment of the present invention performs a stable operation regardless of a change in the core voltage, which is a high data voltage source of a memory cell, thereby improving its own operation reliability.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

A semiconductor memory device according to an embodiment of the present invention may include an arbitrary memory, for example, a DRAM, among various types of memories requiring precharge. For the purpose of convenience, the configuration and the operation of a voltage generation circuit of the present invention will be described while focusing on a bit line precharge voltage generation circuit and a semiconductor memory device including the same.

Figure 3:
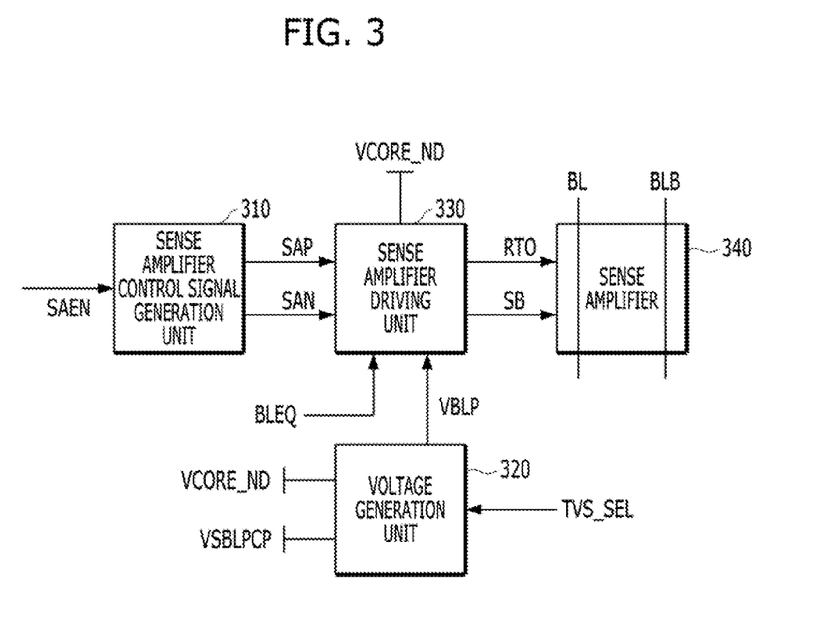
FIG. 3 is a block diagram illustrating a semiconductor memory device, according to an embodiment of the present invention.

FIG. 3 is a block diagram illustrating a semiconductor memory device, according to an embodiment of the present invention.

Referring to FIG. 3, the semiconductor memory device may include a sense amplifier control signal generation unit 310, a voltage generation unit 320, a sense amplifier driving unit 330, and a sense amplifier 340.

The sense amplifier control signal generation unit 310 may generate sense amplifier control signals SAP and SAN in response to a sense amplifier enable signal SAEN. The sense amplifier control signals SAP and SAN may include a pull-up power driving signal SAP and a pull-down power driving signal SAN. The pull-up and pull-down power driving signals SAP, SAN may be activated during a predetermined period.

The voltage generation unit 320 may select one of the voltages supplied to a first and a second source voltage terminals VCORE_ND, VSBLPCP as a source voltage VSRC, in response to a driving mode signal TVS_SEL. The voltage generation unit 320 may then generate a bit line precharge voltage VBLP by dividing the source voltage VSRC based on a resistance ratio which may vary in response to the driving mode signal TVS_SEL. The first source voltage terminal VCORE_ND may be a core voltage terminal. The voltage inputted through the first source voltage terminal VCORE_ND may include a core voltage VCORE or a core-up voltage VCORE_UP having a higher level than that of the core voltage VCORE. The voltage inputted through the second source voltage terminal VSBLPCP may include a voltage having a lower level than that of the core voltage VCORE. In a normal driving mode, the voltage inputted from the first source voltage terminal VCORE_ND may be the core voltage VCORE. In a core-up driving mode, the voltage inputted from the first source voltage terminal VCORE_ND may be the core-up voltage VCORE_UP having a higher level than that of the core voltage VCORE and lower than that of a power supply voltage VDD. Furthermore, the driving mode signal TVS_SEL may be activated at a high logic level in the core-up driving mode. Also, the voltage generation unit 320 may select the voltage supplied to the second source voltage terminal VSBLPCP as the source voltage VSRC in the core-up driving mode.

The sense amplifier driving unit 330 may receive the bit line precharge voltage VBLP inputted from the voltage generation unit 320. The sense amplifier driving unit 330 may also receive the voltage supplied from the first source voltage terminal VCORE_ND, in response to a bit line precharge signal BLEQ and the sense amplifier control signals SAP and SAN. The sense amplifier driving unit 330 may then provide a driving voltage through a pull-up power line RTO and a pull-down power line SB. That is, when the bit line precharge signal BLEQ is activated, the sense amplifier driving unit 330 may provide the sense amplifier 340 with the bit line precharge voltage VBLP through the pull-up and pull-down power lines RTO, SB, and when the pull-up and pull-down power driving signals SAP, SAN are activated, the sense amplifier driving unit 330 may provide the sense amplifier 340 with the voltage inputted through the first source voltage terminal VCORE_ND and a ground voltage VSS through the pull-up and pull-down power lines RTO, SB.

The sense amplifier 340 may sense and amplify data of a bit line pair BL and BLB by using the driving voltage supplied through the pull-up and pull-down power lines RTO, SB. In a normal driving mode, the sense amplifier 340 performs an operation for receiving the bit line precharge voltage VBLP provided through the pull-up and pull-down power lines RTO, SB for precharging the bit line pair BL and BLB, and then receiving the core voltage VCORE and the ground voltage VSS provided through the pull-up and pull-down power lines RTO, SB to sense and amplify memory cell data transmitted through the bit line pair BL and BLB. Furthermore, in the core-up driving mode, the sense amplifier 340 may perform an operation for receiving the bit line precharge voltage VBLP provided through the pull-up and pull-down power lines RTO, SB for precharging the bit line pair BL and BLB, and then receiving the core-up voltage VCORE_UP and the ground voltage VSS provided through the pull-up and pull-down power lines RTO, SB to sense and amplify the memory cell data transmitted through the bit line pair BL and BLB.

Figure 4:
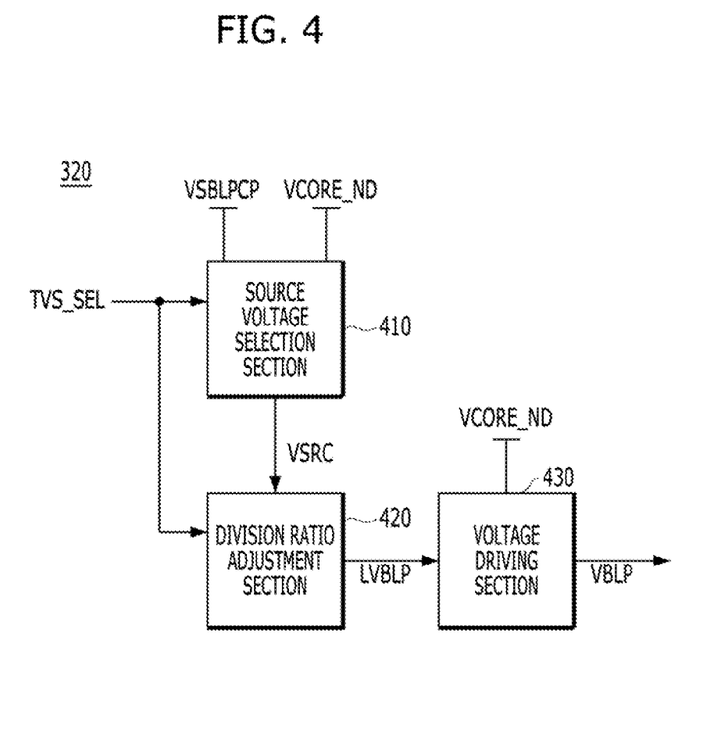
FIG. 4 is a block diagram of a voltage generation unit shown in FIG. 3, according to an embodiment of the present invention.

FIG. 4 is a block diagram of the voltage generation unit 320 shown in FIG. 3, according to an embodiment of the present invention.

Referring to FIG. 4, the voltage generation unit 320 may include a source voltage selection section 410, a division ratio adjustment section 420, and a voltage driving section 430.

The source voltage selection section 410 may select one of the voltages inputted to the first and second source voltage terminals VCORE_ND, VSBLPCP in response to a normal driving mode signal MODE_NORMALB and a core-up driving mode signal MODE_CORE-UPB, and provides the selected voltage as the source voltage VSRC. The normal driving mode signal MODE_NORMALB may correspond to the driving mode signal TVS_SEL of FIG. 3, and the core-up driving mode signal MODE_CORE-UPB may have a phase corresponding to the driving mode signal TVS_SEL of FIG. 3 (see FIG. 5). The first source voltage terminal VCORE_ND may be a core voltage terminal VCORE_ND. The voltage inputted through the first source voltage terminal VCORE_ND may include the core voltage VCORE or the core-up voltage VCORE_UP having a higher level than that of the core voltage VCORE. The voltage inputted through the second source voltage terminal VSBLPCP may be a voltage having a lower level than that of the core voltage VCORE.

The division ratio adjustment section 420 may divide the source voltage VSRC based on a resistance ratio that may be varied based on the core-up driving mode signal MODE_CORE-UPB and the normal driving mode signal MODE_NORMALB. The division ratio adjustment section 420 may output a reference voltage LVBLP. The reference voltage LVBLP may be generated to have a level of one half the core voltage i.e., VCORE/2. The division ratio adjustment section 420 may include, for example, 2*N (N is a natural number) resistors coupled in series between the source voltage VSRC terminal and the ground voltage VSS terminal, where a resistance ratio of at least one of the 2*N resistors may be determined based on the normal driving mode signal MODE_NORMALB and the core-up driving mode signal MODE_CORE-UPB. The reference voltage LVBLP may be outputted from a coupling node of the $N^{th}$ resistor and the $N+1^{th}$ resistor.

The voltage driving section 430 may drive the output terminal in response to the reference voltage LVBLP and may generate the bit line precharge voltage VBLP.

In an embodiment of the present invention, in the core-up driving mode, the bit line precharge voltage VBLP may be generated using a dedicated source voltage, which may be generated using a voltage inputted through the second source voltage terminal VSBLPCP, irrespective of the core voltage VCORE. Accordingly, in the core-up driving mode, the bit line precharge voltage VBLP may not be generated according to the core voltage terminal VCORE_ND. Consequently, in the core-up driving mode, it is possible to ensure a data sensing margin of a data value "0" as well as a data sensing margin of a data value "1".

Hereinafter, with reference to the drawings, circuit configurations of the elements illustrated in FIG. 3 and FIG. 4 will be described.

Figure 5:
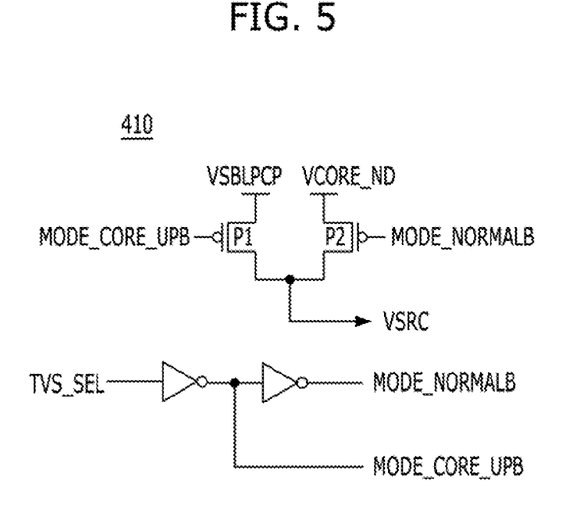
FIG. 5 is a circuit diagram of a source voltage selection section of FIG. 4, according to an embodiment of the present invention.

FIG. 5 is a circuit diagram of the source voltage selection section 410 of FIG. 4, according to an embodiment of the present invention.

Referring to FIG. 5, the source voltage selection section 410 may include a first PMOS transistor P1 coupled between the first source voltage terminal VCORE_ND and the source voltage VSRC terminal for receiving the core-up driving mode signal MODE_CORE-UPB through a gate thereof. The source voltage selection section 410 may include a second PMOS transistor P2 coupled between the second source voltage terminal VSBLPCP and the source voltage VSRC terminal for receiving the normal up driving mode signal MODE_NORMALB through a gate thereof.

Hence, when the normal driving mode signal MODE_NORMALB is activated (i.e., in a normal driving mode), the source voltage selection section 410 may select the core voltage VCORE provided through the first source voltage terminal VCORE_ND, that is, the core voltage terminal, and output the selected core voltage VCORE as the source voltage VSRC. Further, when the core-up driving mode signal MODE_CORE-UPB is activated (i.e., in the core-up driving mode), the source voltage selection section 410 may select the voltage provided through the second source voltage terminal VSBLPCP, that is, the voltage having a lower level than that of the core voltage VCORE, and output the selected voltage as the source voltage VSRC.

Figure 6:
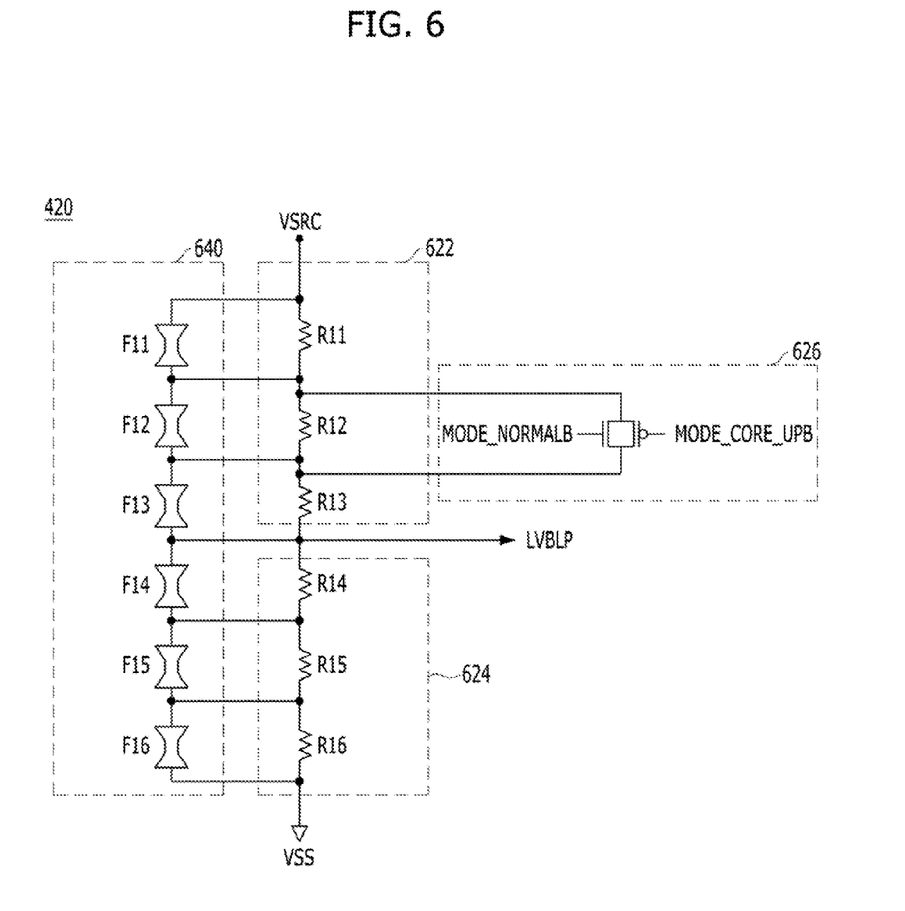
FIG. 6 is a circuit diagram of a division ratio adjustment section of FIG. 4, according to an embodiment of the present invention.

FIG. 6 is a circuit diagram of the division ratio adjustment section 420 of FIG. 4, according to an embodiment of the present invention.

Referring to FIG. 6, the division ratio adjustment section 420 may include a first resistor group 622 having N resistors R11 to R13 coupled in series between the source voltage VSRC terminal and a reference voltage LVBLP terminal, a second resistor group 624 having N resistors coupled in series between the reference voltage LVBLP terminal and the ground voltage VSS terminal, and a switch 626 which may be turned on in response to the normal up driving mode signal MODE_NORMALB and coupled in parallel to at least one resistor of the first resistor group, for example, resistor R12.

The division ratio adjustment section 420 may further include a voltage trimming part 640 that may adjust the source voltage VSRC inputted from the source voltage VSRC terminal and allow the reference voltage LVBLP to have a level of VCORE/2. The voltage trimming part 640 may include a plurality of fuses F11 to F16 coupled in parallel to the resistors of the first and second resistor groups 622, 624 in a one-to-one manner. In addition, the voltage trimming part 640 may adjust a resistance ratio of the resistors R11 to R16 by using a metal option, a logic and the like instead of the plurality of fuses F11 to F16, thereby trimming the level of the reference voltage LVBLP.

In an embodiment of the present invention, when a voltage supplied to the second source voltage terminal (VSBLPCP of FIG. 5) is selected as the source voltage VSRC, the division ratio adjustment section 420 may reduce a resistance ratio of the second resistor group 624 with respect to the first resistor group 622. For example, when the normal up driving mode signal MODE_NORMALB is activated (i.e., In a normal driving mode), the core voltage VCORE may be provided through the first source voltage terminal VCORE_ND, and the switch 626 of the division ratio adjustment section 420 may be turned off. Hence, the resistance ratio of the second resistor group 624 with respect to the first resistor group 622 may be 1:1, so that it is possible to generate and output the reference voltage LVBLP having a level of VCORE/2, similarly as described above. When the core-up driving mode signal MODE_CORE-UPB is activated (i.e., in the core-up driving mode), a voltage having a lower level than that of the core voltage VCORE may be provided as the source voltage VSRC through the second source voltage terminal VSBLPCP, and the switch 626 of the division ratio adjustment section 420 may be turned on. Consequently, since the resistance ratio of the second resistor group 624 with respect to the first resistor group 622 may be increased to 2:3, even though the voltage having a lower level than that of the core voltage VCORE is provided as the source voltage VSRC, it is possible to generate and output the reference voltage LVBLP having a level of VCORE/2, according to the increased resistance ratio.

Figure 7:
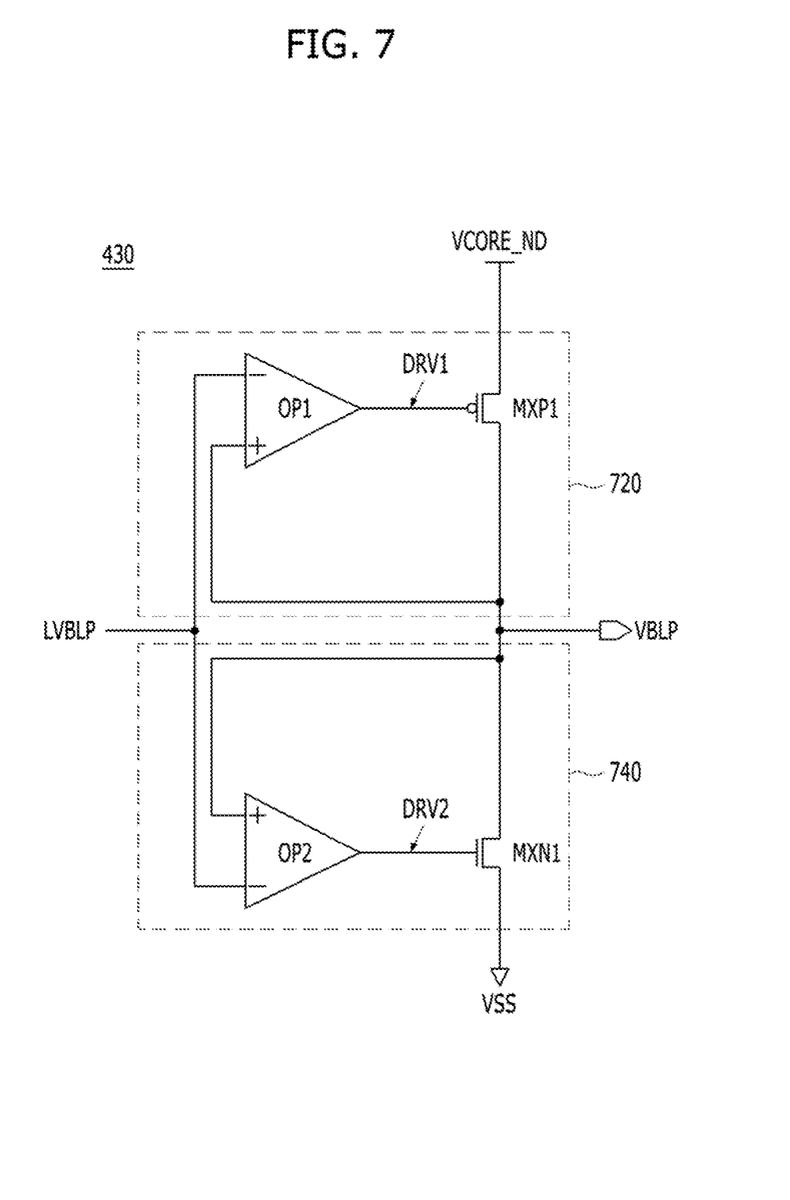
FIG. 7 is a circuit diagram of a voltage driving section of FIG. 4, according to an embodiment of the present invention.

FIG. 7 is a circuit diagram of the voltage driving section 430 of FIG. 4.

Referring to FIG. 7, the voltage driving section 430 may include a pull-up driving part 720 that may receive the reference voltage LVBLP and the bit line precharge voltage VBLP to pull-up drive a bit line precharge voltage VBLP terminal, and a pull-down driving part 740 that may receive the reference voltage LVBLP and the bit line precharge voltage VBLP to pull-down drive the bit line precharge voltage VBLP terminal.

The pull-up driving part 720 may include a first differential amplifier OP1 that may receive the reference voltage LVBLP and feedback of the bit line precharge voltage VBLP, and differentially amplifies a voltage difference between them, and outputs a first driving signal DRV1, and a PMOS transistor MXP1 coupled between the source voltage VSRC terminal and the bit line precharge voltage VBLP terminal and receiving the first driving signal DRV1 through a gate thereof. The pull-down driving part 740 may include a second differential amplifier OP2 that may receive the reference voltage LVBLP and the feedback of the bit line precharge voltage VBLP, and differentially amplifies a voltage difference between them, and outputs a second driving signal DRV2, and a NMOS transistor MXN1 coupled between the ground voltage VSS terminal and the bit line precharge voltage VBLP terminal and receiving the second driving signal DRV2 through a gate thereof.

Accordingly, when the level of the bit line precharge voltage VBLP decreases by current consumption in precharge, the first differential amplifier OP1 compares the reference voltage LVBLP generated to have a level of VCORE/2, with the bit line precharge voltage VBLP, and outputs the first driving signal DRV1 at a low level, and the PMOS transistor MXP1 pull-up may drive the bit line precharge voltage VBLP terminal in response to the first driving signal DRV1. Accordingly, the level of the bit line precharge voltage VBLP may rise again. However, when the level of the bit line precharge voltage VBLP increases by the supply of a current, the second differential amplifier OP2 compares the reference voltage LVBLP generated to have a level of VCORE/2, with the bit line precharge voltage VBLP, and outputs the second driving signal DRV2 at a high level, and the NMOS transistor MXN1 pull-down may drive the bit line precharge voltage VBLP terminal in response to the second driving signal DRV2. Accordingly, the level of the bit line precharge voltage VBLP may fall again.

Through the aforementioned process, the voltage driving section 430 regulates a voltage outputted from the bit line precharge voltage VBLP terminal, that is, the bit line precharge voltage VBLP. Consequently, the division ratio adjustment section 420 may substantially maintain the level of the reference voltage LVBLP to a level of VCORE/2, thereby generating the bit line precharge voltage VBLP. Furthermore, the first source voltage terminal VCORE_ND coupled to the voltage driving section 430 merely relates to a source voltage used to pull-up drive the bit line precharge voltage VBLP terminal, and does not cooperate with the level of the bit line precharge voltage VBLP.

Figure 8:
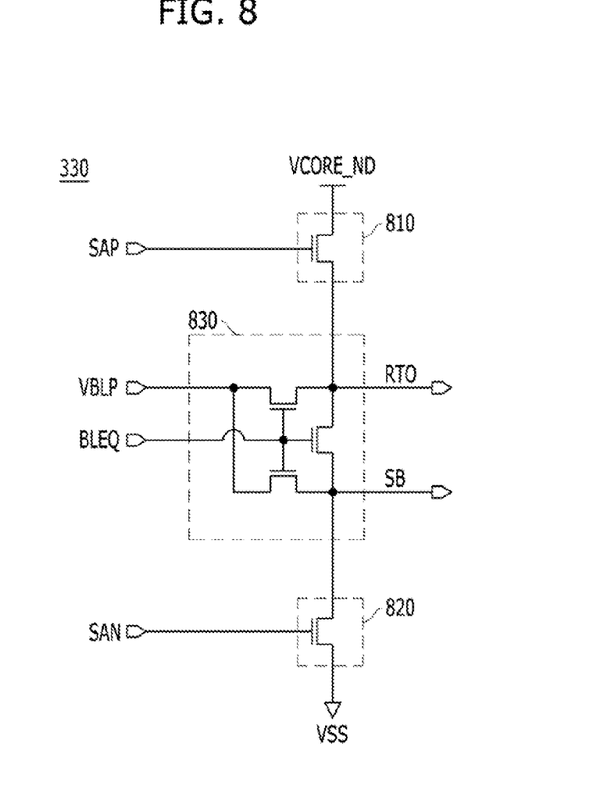
FIG. 8 is a circuit diagram of a sense amplifier driving unit of FIG. 3, according to an embodiment of the present invention.

FIG. 8 is a diagram of the sense amplifier driving unit 330 shown in FIG. 3.

Referring to FIG. 8, the sense amplifier driving unit 330 may include a pull-up voltage supply section 810, a pull-down voltage supply section 820, and a precharge voltage supply section 830.

The pull-up voltage supply section 810 provides a voltage inputted to the first source voltage terminal VCORE_ND to the pull-up power line RTO in response to the pull-up power driving signal SAP. The pull-down voltage supply section 820 provides the ground voltage VSS to the pull-down power line SB in response to the pull-down power driving signal SAN. The precharge voltage supply section 830 provides the bit line precharge voltage VBLP inputted from the voltage generation unit 320 to the pull-up and pull-down power lines RTO, SB in response to the bit line precharge signal BLEQ.

Accordingly, when the bit line precharge signal BLEQ may be activated, the sense amplifier driving unit 330 provides the bit line precharge voltage VBLP to the sense amplifier (340 of FIG. 3) through the pull-up and pull-down power lines RTO, SB, thereby precharging the bit line pair BL and BLB. When the pull-up and pull-down power driving signals SAP, SAN are activated, the sense amplifier driving unit 330 provides the voltage supplied from the first source voltage terminal VCORE_ND and the ground voltage VSS to the sense amplifier 340 through the pull-up and pull-down power lines RTO, SB, thereby sensing and amplifying memory cell data transmitted through the bit line pair BL and BLB.

In an embodiment of the present invention, In a normal driving mode, the sense amplifier driving unit 330 may respectively provide the pull-up and pull-down power lines RTO, SB with the core voltage VCORE inputted through the first source voltage terminal VCORE_ND and the ground voltage VSS, and in the core-up driving mode, the sense amplifier driving unit 330 may respectively provide the pull-up and pull-down power lines RTO, SB with the core-up voltage VCORE_UP inputted through the first source voltage terminal VCORE_ND and the ground voltage VSS.

Figure 9:
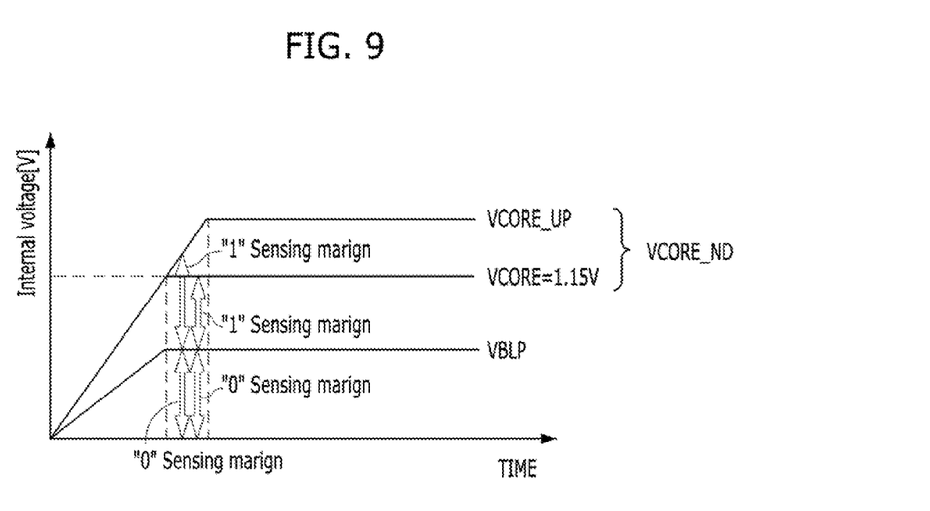
FIG. 9 is a graph illustrating a data margin of a semiconductor memory device, according to an embodiment of the present invention in a low voltage environment.

FIG. 9 is a graph for describing a data margin of the semiconductor memory device shown in FIG. 3, in a low voltage environment.

Referring to FIG. 9, in an embodiment of the present invention, in the core-up driving mode, the bit line precharge voltage VBLP may be generated using a dedicated source voltage irrelative to the core voltage VCORE, that is, a voltage inputted through the second source voltage terminal VSBLPCP. Accordingly, in the core-up driving mode, the bit line precharge voltage VBLP is not generated according to the core voltage terminal VCORE_ND and may be generated according to the voltage inputted through the second source voltage terminal VSBLPCP. Since the voltage inputted through the second source voltage terminal VSBLPCP has a lower level than that of the core voltage VCORE, the bit line precharge voltage VBLP may quickly reach a target level as compared with the case in which the bit line precharge voltage VBLP may be generated in accordance with the core voltage terminal VCORE_ND. Consequently, in the core-up driving mode, it is possible to ensure a data sensing margin of a data value "0" as well as a data sensing margin of a data value "1".

Hereinafter, with reference to FIG. 3 to FIG. 9, an operation of the semiconductor memory device according to the embodiment of the present invention will be described.

In a normal driving mode (i.e., when the normal driving mode signal MODE_NORMALB may be activated), the core voltage VCORE is inputted through the first source voltage terminal VCORE_ND.

In response to the activated normal driving mode signal MODE_NORMALB, the voltage generation unit 320 may select the core voltage VCORE, supplied through the first source voltage terminal VCORE_ND, as the source voltage VSRC, and based on a resistance ratio determined based on the normal driving mode signal MODE_NORMALB, the voltage generation unit 320 may generate the bit line precharge voltage VBLP. The resistance ratio of the second resistor group 624 with respect to the first resistor group 622 of the division ratio adjustment section 420 in the voltage generation unit 320 becomes 1:1, so that it is possible to generate and output the reference voltage LVBLP having a level of VCORE/2.

When the bit line precharge signal BLEQ may be activated, the sense amplifier driving unit 330 provides the bit line precharge voltage VBLP to the sense amplifier 340 through the pull-up and pull-down power lines RTO, SB. The sense amplifier 340 may receive the bit line precharge voltage VBLP and precharges the bit line pair BL and BLB. Then, when the pull-up and pull-down power driving signals SAP, SAN are activated, the sense amplifier driving unit 330 provides a voltage supplied from the first source voltage terminal VCORE_ND, that is, the core voltage VCORE, and the ground voltage VSS to the sense amplifier 340 through the pull-up and pull-down power lines RTO, SB. The sense amplifier 340 may receive the core voltage VCORE and the ground voltage VSS, and may sense and amplify memory cell data transmitted through the bit line pair BL and BLB.

In the core-up driving mode (i.e., when the core-up driving mode signal MODE_CORE-UPB may be activated), the core-up voltage VCORE_UP is inputted through the first source voltage terminal VCORE_ND.

In response to the activated core-up driving mode signal MODE_CORE-UPB, the voltage generation unit 320 may select a voltage, supplied through the second source voltage terminal VSBLPCP, as the source voltage VSRC, and based on a resistance ratio determined based on the core-up driving mode signal MODE_CORE-UPB, the voltage generation unit 320 may generate the bit line precharge voltage VBLP. Since the resistance ratio of the second resistor group 624 with respect to the first resistor group 622 of the division ratio adjustment section 420 in the voltage generation unit 320 becomes 2:3, even though a voltage having a lower level than that of the core voltage VCORE is provided as the source voltage VSRC, it is possible to generate and output the reference voltage LVBLP having a level of VCORE/2, according to the increased resistance ratio.

When the bit line precharge signal BLEQ may be activated, the sense amplifier driving unit 330 provides the bit line precharge voltage VBLP to the sense amplifier 340 through the pull-up and pull-down power lines RTO, SB. The sense amplifier 340 may receive the bit line precharge voltage VBLP and precharges the bit line pair BL and BIB. Then, when the pull-up and pull-down power driving signals SAP, SAN are activated, the sense amplifier driving unit 330 provides a voltage supplied from the first source voltage terminal VCORE_ND, that is, the core-up voltage VCORE_UP, and the ground voltage VSS to the sense amplifier 340 through the pull-up and pull-down power lines RTO, SB. The sense amplifier 340 may receive the core-up voltage VCORE_UP and the ground voltage VSS, and may sense and amplify memory cell data transmitted through the bit line pair BL and BLB.

According to the embodiment of the present invention as described above, even though the level of a voltage supplied to the core voltage terminal rises according to the core-up driving operation, since it does not have an influence on the bit line precharge voltage VBLP, it is advantageous that an internal circuit receiving the bit line precharge voltage VBLP may perform a stable internal operation.

Although various embodiments have been described for illustrative purposes, it will be apparent to those skilled in the art that various changes and modifications may be made without departing from the spirit and scope of the invention as defined in the following claims.

For example, in an embodiment of the present invention, a bit line precharge voltage has been described as an example; however, the present invention is not limited thereto. The present invention can also be applied to an internal voltage such as a cell plate voltage generated based on a core voltage. Furthermore, the positions and the types of the logic gates and the transistors in the aforementioned embodiment may be differently realized according to the polarities of inputted signals.

What is claimed is:

1. A semiconductor memory device comprising:
   a voltage generation unit suitable for selecting one of the voltages which are supplied to a first and a second source voltage terminals, as a source voltage based on a driving mode signal, and generating a bit line precharge voltage by dividing the source voltage according to a resistance ratio determined based on the driving mode signal;
   a sense amplifier driving unit suitable for receiving the bit line precharge voltage based on a bit line precharge signal and a sense amplifier control signal, and providing a driving voltage through a pull-up power line and a pull-down power line; and
   a bit line sense amplifier suitable for sensing and amplifying data of a bit line pair by using the driving voltage supplied through the pull-up power line and the pull-down power line.

2. The semiconductor memory device of claim 1, wherein a voltage supplied through the first source voltage terminal is a core voltage or a core-up voltage having a higher level than a level of the core voltage, and a voltage supplied through the second source voltage terminal has a lower level than the level of the core voltage.

3. The semiconductor memory device of claim 2, wherein the core voltage is supplied through the first source voltage terminal in a normal driving mode, and the core-up voltage is supplied through the first source voltage terminal in a core-up driving mode.

4. The semiconductor memory device of claim 3, wherein, in the core-up driving mode, the driving mode signal is activated and the voltage generation unit selects the voltage supplied through the second source voltage terminal as the source voltage.

5. The semiconductor memory device of claim 2, wherein the voltage generation unit comprises:
   a source voltage selection section suitable for selecting one of the voltages supplied to the first source voltage terminal and the second source voltage terminal in response to the driving mode signal, and providing the selected voltage as the source voltage;
   a division ratio adjustment section suitable for dividing the source voltage based on the resistance ratio determined based on the driving mode signal, and outputting a reference voltage; and
   a voltage driving section suitable for driving an output terminal in response to the reference voltage and generating the bit line precharge voltage.

6. The semiconductor memory device of claim 5, wherein the source voltage selection section selects the voltage supplied through the first source voltage terminal as the source voltage in a normal driving mode, and selects the voltage supplied through the second source voltage terminal as the source voltage in the core-up driving mode.

7. The semiconductor memory device of claim 5, wherein the division ratio adjustment section comprises:
   a first resistor group having N resistors coupled in series between a source voltage terminal and a reference voltage terminal;
   a second resistor group having N resistors coupled in series between the reference voltage terminal and a ground voltage terminal; and
   a switch which is turned on in response to the driving mode signal and coupled in parallel to at least one resistor of the first resistor group.

8. The semiconductor memory device of claim 7, wherein, when the voltage supplied to the second source voltage terminal is selected as the source voltage, the division ratio adjustment section increases a resistance ratio of the second resistor group with respect to the first resistor group.

9. The semiconductor memory device of claim 7, wherein the division ratio adjustment section further comprises:
   a voltage trimming part including a plurality of fuses coupled in parallel to the resistors of the first resistor group and the second resistor group in a one-to-one manner.

10. The semiconductor memory device of claim 5, wherein the voltage driving section comprises:
    a pull-up driving part suitable for receiving the reference voltage and the bit line precharge voltage and pull-up driving a bit line precharge voltage terminal; and
    a pull-down driving part suitable for receiving the reference voltage and the bit line precharge voltage and pull-down driving the bit line precharge voltage terminal.

11. The semiconductor memory device of claim 1, wherein the sense amplifier driving unit provides the bit line precharge voltage to the sense amplifier through the pull-up power line and the pull-down power line when the bit line precharge signal is activated, and
    provides the voltage supplied from the first source voltage terminal and a ground voltage to the sense amplifier through the pull-up power line and the pull-down power line when the sense amplifier control signal is activated.

12. The semiconductor memory device of claim 11, wherein, in the normal driving mode and the core-up driving mode, the sense amplifier performs an operation for receiving the bit line precharge voltage provided through the pull-up power line and the pull-down power line for precharging the bit line pair, and receiving the voltage, supplied from the first source voltage terminal, and the ground voltage, which are provided through the pull-up power line and the pull-down power line, to sense and amplify memory cell data transmitted through the bit line pair.

13. A voltage generation circuit comprising:
 a source voltage selection section suitable for selecting one of voltages supplied to a first source voltage terminal and a second source voltage terminal in response to a driving mode signal, and providing the selected voltage as a source voltage;
 a division ratio adjustment section suitable for dividing the source voltage based on a resistance ratio determined based on the driving mode signal, and outputting a reference voltage; and
 a voltage driving section suitable for driving an Internal voltage terminal in response to the reference voltage and generating an internal voltage.

14. The voltage generation circuit of claim 13, wherein the voltage supplied to the second source voltage terminal is smaller than the voltage supplied to the first source voltage terminal.

15. The voltage generation circuit of claim 14, wherein the division ratio adjustment section includes 2*N resistors coupled in series between a source voltage terminal and a ground voltage terminal N being a natural number, wherein a resistance ratio of at least one of the 2*N resistors is determined based on the driving mode signal and the reference voltage is outputted from a coupling node of an $N^{th}$ resistor and an $N+1^{th}$ resistor.

16. The voltage generation circuit of claim 14, wherein the division ratio adjustment section comprises:
 a first resistor group having N resistors coupled in series between a source voltage terminal and a reference voltage terminal;
 a second resistor group having N resistors coupled in series between the reference voltage terminal and a ground voltage terminal; and
 a switch which is turned on in response to the driving mode signal and coupled in parallel to at least one resistor of the first resistor group.

17. The voltage generation circuit of claim 16, wherein when the voltage supplied to the second source voltage terminal is selected as the source voltage, the division ratio adjustment section increases a resistance ratio of the second resistor group with respect to the first resistor group.

18. The voltage generation circuit of claim 16, wherein the division ratio adjustment section further comprises:
 a voltage trimming part including a plurality of fuses coupled in parallel to the resistors of the first resistor group and the second resistor group in a one-to-one manner.

19. The voltage generation circuit of claim 13, wherein the voltage driving section comprises:
 a pull-up driving part suitable for receiving the reference voltage and the internal voltage and pull-up driving the internal voltage terminal; and
 a pull-down driving part suitable for receiving the reference voltage and the internal voltage and pull-down driving the internal voltage terminal.

20. The voltage generation circuit of claim 19, wherein the pull-up driving part comprises:
 a differential amplifier suitable for receiving and differentially amplifying the reference voltage and the internal voltage and outputting a first driving signal; and
 a PMOS transistor coupled between the source voltage terminal and the internal voltage terminal and receiving the first driving signal through a gate thereof.

21. The voltage generation circuit of claim 19, wherein the pull-down driving part comprises:
 a differential amplifier suitable for receiving and differentially amplifying the reference voltage and the internal voltage and outputting a second driving signal; and
 a NMOS transistor coupled between the ground voltage terminal and the internal voltage terminal and receiving the second driving signal through a gate thereof.

22. A method for driving a semiconductor memory device, comprising:
 selecting one of voltages supplied to a first source voltage terminal and a second source voltage terminal as a source voltage in response to a driving mode signal, and generating a bit line precharge voltage by dividing the source voltage based on a resistance ratio determined based on the driving mode signal;
 providing the bit line precharge voltage to a sense amplifier as a driving voltage through a pull-up power line and a pull-down power line in response to a bit line precharge signal, and providing a voltage supplied from the first source voltage terminal and a ground voltage to the sense amplifier as a driving voltage through the pull-up power line and the pull-down power line in response to a sense amplifier control signal; and
 sensing and amplifying data of a bit line pair by using the driving voltage supplied through the pull-up power line and the pull-down power line.

23. The method of claim 22, wherein a voltage supplied through the first source voltage terminal is a core voltage or a core-up voltage having a higher level than a level of the core voltage, and a voltage supplied through the second source voltage terminal has a lower level than the level of the core voltage.

24. The method of claim 23, wherein, in a normal driving mode, the core voltage is supplied through the first source voltage terminal, and in a core-up driving mode, the core-up voltage is supplied through the first source voltage terminal.

25. The method of claim 24, wherein, in the generating of the bit line precharge voltage,
 the core voltage supplied through the first source voltage terminal is selected as the source voltage in the normal driving mode, and
 the voltage supplied through the second source voltage terminal is selected as the source voltage, the resistance ratio is increased to increase a division ration of the source voltage, and the bit line precharge voltage is generated in the core-up driving mode.

26. The method of claim 22, wherein the sensing and amplifying of the data of the bit line pair further includes,
 the bit line precharge voltage provided through the pull-up power line and the pull-down power line is received for precharging the bit line pair, and the voltage, supplied from the first source voltage terminal, and the ground voltage, which are provided through the pull-up power line and the pull-down power line, are received to sense and amplify memory cell data transmitted through the bit line pair.

\* \* \* \* \*